United States Patent
Shin et al.

(10) Patent No.: US 8,741,710 B2
(45) Date of Patent: Jun. 3, 2014

(54) METHODS OF FABRICATING SEMICONDUCTOR DEVICES USING A PLASMA PROCESS WITH NON-SILANE GAS INCLUDING DEUTERIUM

(75) Inventors: Dong-Suk Shin, Gyeonggi-do (KR); Ho Lee, Chungcheongnam-do (KR); Tae-Gyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 620 days.

(21) Appl. No.: 12/248,431

(22) Filed: Oct. 9, 2008

(65) Prior Publication Data

US 2009/0104741 A1    Apr. 23, 2009

(30) Foreign Application Priority Data

Oct. 18, 2007  (KR) .................. 10-2007-0105193

(51) Int. Cl.
*H01L 21/8238*    (2006.01)
*H01L 21/336*    (2006.01)

(52) U.S. Cl.
USPC ................... 438/229; 438/301; 257/E21.409; 257/E21.632

(58) Field of Classification Search
None
See application file for complete search history.

(56) References Cited

U.S. PATENT DOCUMENTS

| | | | |
|---|---|---|---|
| 6,030,863 A * | 2/2000 | Chang et al. | 438/229 |
| 6,740,605 B1 * | 5/2004 | Shiraiwa et al. | 438/795 |
| 7,015,153 B1 | 3/2006 | Triyoso et al. | |
| 7,071,069 B2 * | 7/2006 | Tan et al. | 438/306 |
| 7,214,630 B1 * | 5/2007 | Varadarajan et al. | 438/778 |
| 7,327,001 B1 * | 2/2008 | Singhal et al. | 257/377 |
| 2003/0134231 A1 * | 7/2003 | Tsai et al. | 430/312 |
| 2004/0191945 A1 * | 9/2004 | Yamaguchi et al. | 438/48 |
| 2004/0253791 A1 * | 12/2004 | Sun et al. | 438/308 |
| 2005/0062113 A1 * | 3/2005 | Watanabe | 257/410 |
| 2005/0067661 A1 * | 3/2005 | Choi | 257/408 |
| 2006/0099725 A1 * | 5/2006 | Shioya et al. | 438/9 |
| 2006/0113615 A1 | 6/2006 | Lee et al. | |
| 2006/0160290 A1 * | 7/2006 | Chong et al. | 438/199 |
| 2006/0214198 A1 * | 9/2006 | Matsuki et al. | 257/288 |
| 2007/0037413 A1 | 2/2007 | Ishihara et al. | |
| 2007/0123012 A1 * | 5/2007 | Walther et al. | 438/510 |
| 2008/0090369 A1 * | 4/2008 | Akiyama et al. | 438/308 |
| 2008/0124922 A1 * | 5/2008 | Kawamura et al. | 438/664 |
| 2008/0128823 A1 * | 6/2008 | Takeoka | 257/369 |
| 2009/0020831 A1 * | 1/2009 | Ramkumar et al. | 257/406 |

FOREIGN PATENT DOCUMENTS

| | | |
|---|---|---|
| JP | 2002-118252 | 4/2002 |
| KR | 2000-0057747 A | 9/2000 |
| KR | 10-2006-0058844 A | 6/2006 |

\* cited by examiner

*Primary Examiner* — Calvin Choi
(74) *Attorney, Agent, or Firm* — Myers Bigel Sibley & Sajovec PA

(57) ABSTRACT

Semiconductor devices are fabricated using a plasma process with a non-silane gas that includes deuterium, and which may result in improved device reliability and/or other improved device operational characteristics. One such method can include forming a gate oxide layer on a transistor region, which is defined on a substrate, and forming a gate electrode on the gate oxide layer. An etch stop layer is formed on the gate oxide layer and the gate electrode. A plasma process is performed on the interface between the gate oxide layer and the substrate using a non-silane treatment gas including deuterium. An interlayer dielectric layer is formed on the etch stop layer. A bottom metal line is formed on the interlayer dielectric layer.

16 Claims, 18 Drawing Sheets

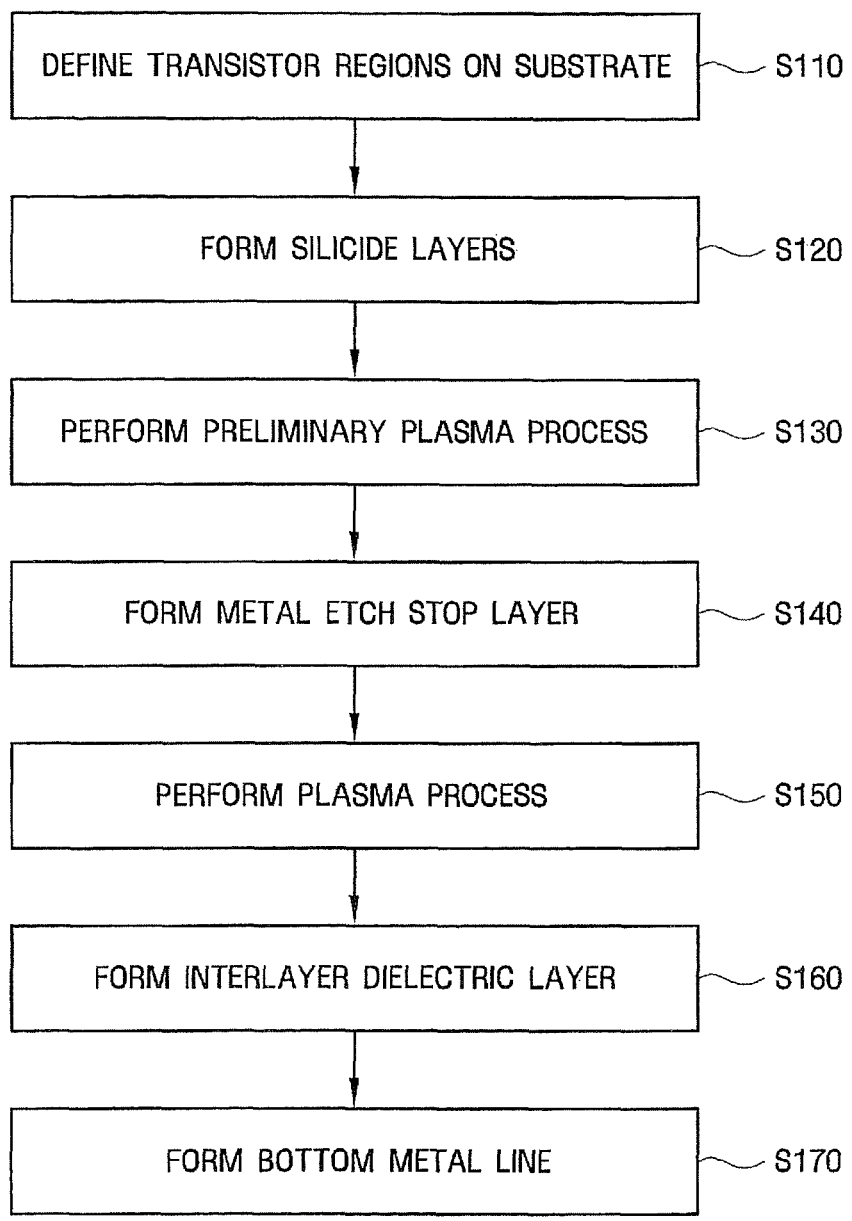

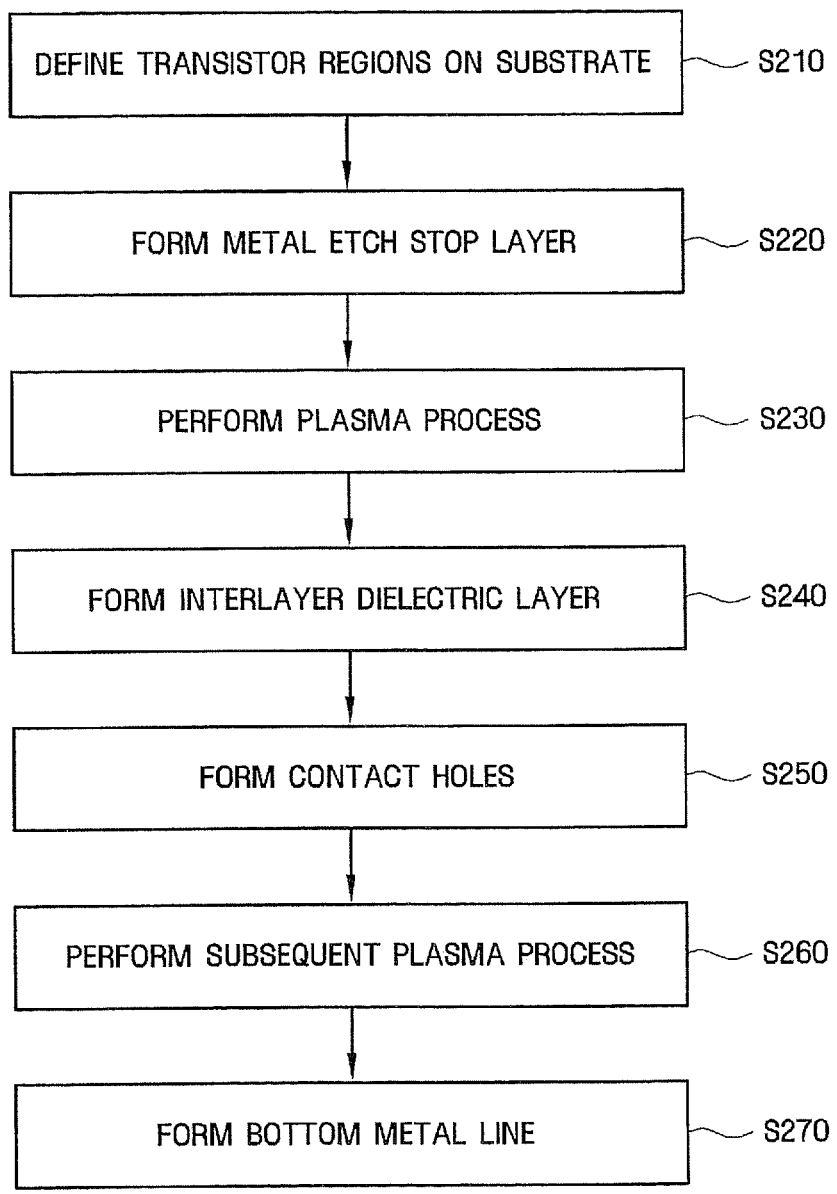

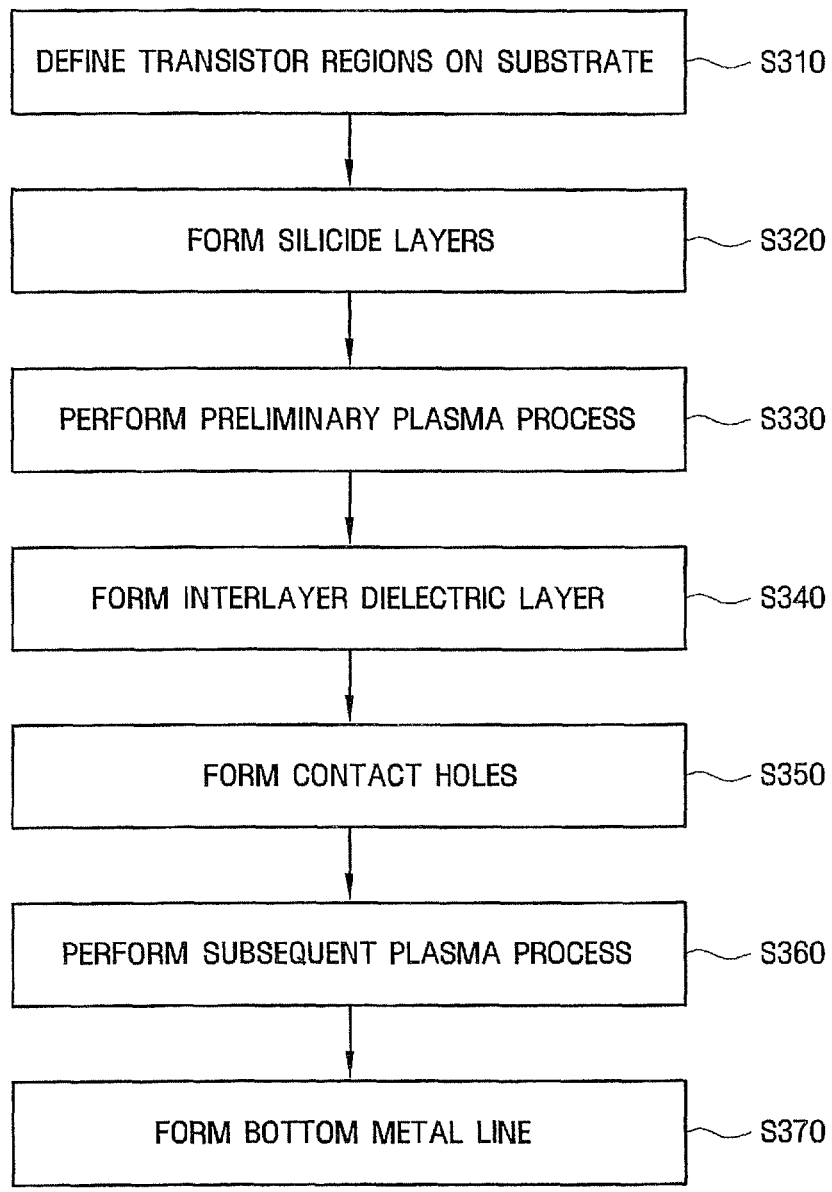

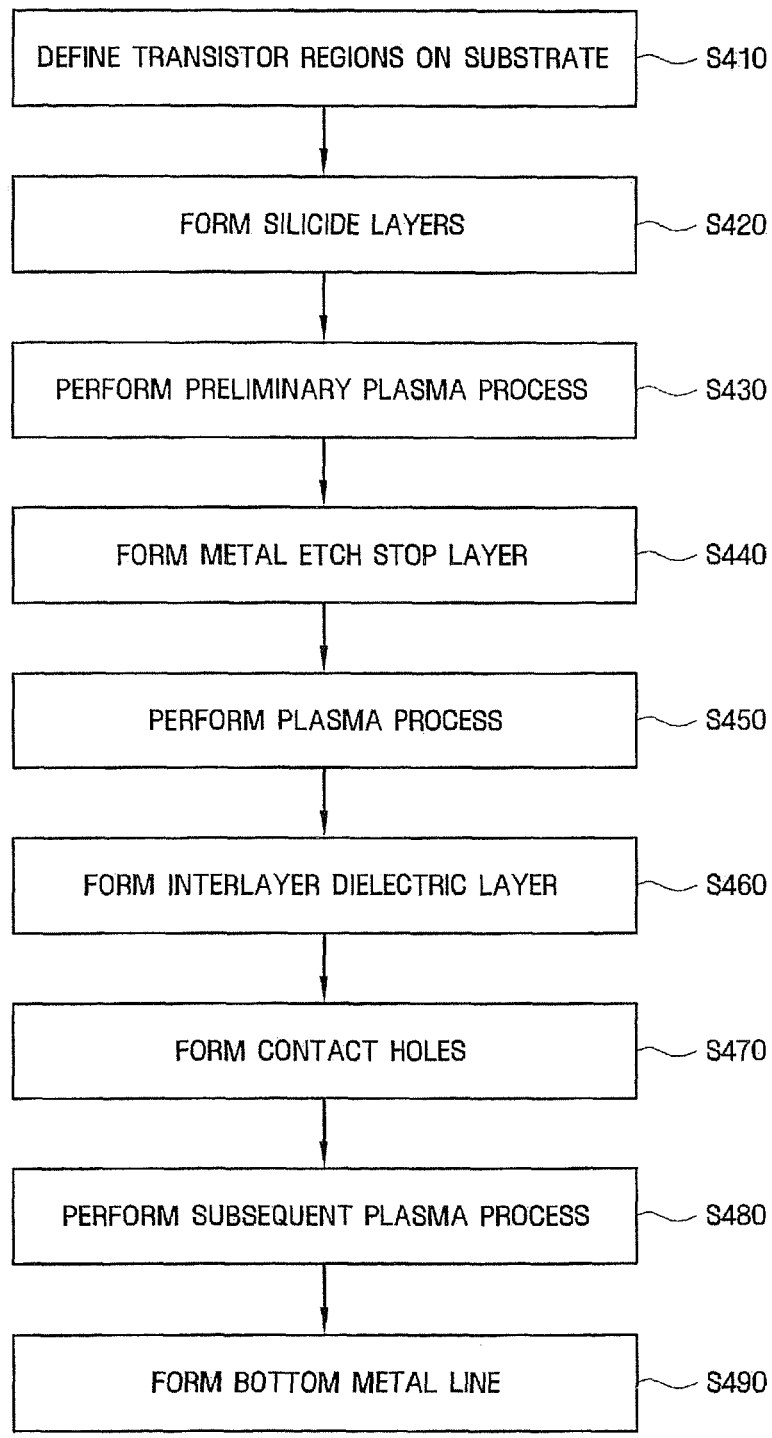

METHODS OF FABRICATING SEMICONDUCTOR DEVICES USING A PLASMA PROCESS WITH NON-SILANE GAS INCLUDING DEUTERIUM

CROSS-REFERENCE TO RELATED APPLICATION

This application claims priority from Korean Patent Application No. 10-2007-0105193 filed on Oct. 18, 2007 in the Korean Intellectual Property Office, the disclosure of which is incorporated herein by reference in its entirety.

BACKGROUND OF THE INVENTION

1. Field of the Invention

The present invention relates to methods of fabricating semiconductor devices.

2. Description of the Related Art

In the course of fabricating a semiconductor device, several deposition processes and thermal process are performed. For example, a dielectric layer can be formed through a deposition process that deposits a silicon oxide film or a silicon oxy-nitride film on a substrate. A silicide layer may also be deposited on a substrate in order to reduce contact resistance of a gate electrode. The deposition processes for the dielectric layer and the silicide layer are carried out at a high-temperature.

During deposition of the dielectric layer, a number of Si—H bonds are formed on surfaces of the substrate and a gate dielectric layer. The Si—H bonds can then be destroyed when thermal energy is applied to the substrate during subsequent processes. When negative electric power is applied to a gate electrode on the top of the gate dielectric layer, a hot carrier injection (HCI) phenomenon and/or a negative bias temperature instability (NBTI) phenomenon can occur. The HCI phenomenon can include movement of substrate holes to a gate oxide layer. The NBTI phenomenon can include movement of $H^+$ ions of the Si—H bonds toward the gate electrode. The HCI and NBTT phenomenon may result in a change in the threshold voltage of the associated semiconductor device and may deteriorate its operational characteristics.

SUMMARY OF THE INVENTION

Various embodiments of the present invention fabricate semiconductor devices using a plasma process with a non-silane gas that includes deuterium, and which may result in improved device reliability and/or other improved device operational characteristics.

According to one embodiment of the present invention, a method for fabricating a semiconductor device includes forming a gate oxide layer on a transistor region, which is defined on a substrate, and a gate electrode on the gate oxide layer. An etch stop layer is formed on the gate oxide layer and the gate electrode. A plasma process is performed on the interface between the gate oxide layer and the substrate using a non-silane treatment gas including deuterium after forming the etch stop layer. An interlayer dielectric layer is formed on the etch stop layer. A bottom metal line is formed on the interlayer dielectric layer.

According to another embodiment of the present invention, a method for fabricating a semiconductor device includes forming a gate oxide layer on a substrate and a gate electrode on the gate oxide layer, and forming a first spacer on opposite side walls of the gate electrode and a second spacer on each first spacer, and a low-concentration source/drain region arranged with the first spacer and a high-concentration source/drain region arranged with the second spacer. A silicide layer is formed on the gate electrode and the high-concentration source/drain region. A preliminary plasma process is performed on the interface between the gate oxide layer and the substrate after forming the silicide layer. An etch stop layer is formed on the surface of the substrate. A plasma process is performed again on the interface between the gate oxide layer and the substrate after forming the etch stop layer. An interlayer dielectric layer is formed on the etch stop layer. A subsequent plasma process is performed again on the interface between the gate oxide layer and the substrate after forming the interlayer dielectric layer. A bottom metal line is formed on the interlayer dielectric layer. The preliminary plasma process, the plasma process, and the subsequent plasma process are performed using a non-silane treatment gas including deuterium.

According to another embodiment of the present invention, a semiconductor device includes a gate oxide layer on a transistor region of a substrate, and a gate electrode on the gate oxide layer. An interface region between the gate oxide layer and the substrate includes deuterium.

According to yet another embodiment of the present invention, a method for fabricating a semiconductor device includes forming a gate oxide layer on a transistor region, which is defined on a substrate, and a gate electrode on the gate oxide layer. A silicide layer is formed on the transistor region. A preliminary plasma process is performed on the interface between the gate oxide layer and the substrate after forming the silicide layer. An interlayer dielectric layer is formed on the silicide layer. A subsequent plasma process is performed again on the interface between the gate oxide layer and the substrate after forming the interlayer dielectric layer. A bottom metal line is formed on the interlayer dielectric layer. The preliminary plasma process and the plasma process are performed using a non-silane treatment gas including deuterium.

BRIEF DESCRIPTION OF THE DRAWINGS

The above and other features and advantages of the present invention will become more apparent in view of the following detailed example embodiments thereof with reference to the attached drawings in which:

FIG. 1 is a flowchart illustrating methods for fabricating a semiconductor device according to some embodiments of the present invention;

FIG. 4 is a flowchart illustrating methods for fabricating a semiconductor device according to some other embodiments of the present invention;

FIG. 6 is a flowchart illustrating methods for fabricating a semiconductor device according to some other embodiments of the present invention;

FIG. 7 is a flowchart illustrating methods for fabricating a semiconductor device according to some other embodiments of the present invention.

DETAILED DESCRIPTION OF THE INVENTION

Figure 2A:
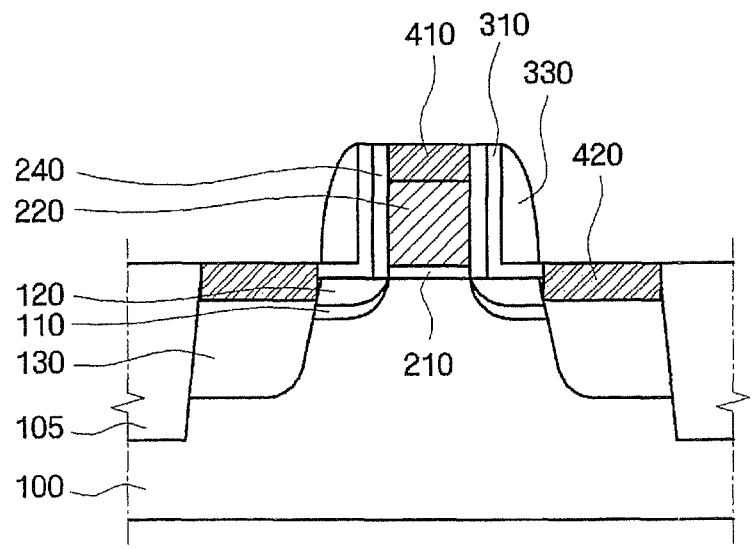
FIGS. 2A to 2D are cross-sectional views showing parts of the semiconductor device to explain the fabrication procedures of the methods in FIG. 1.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like reference numerals refer to like elements throughout. As used herein, the term "and/or" includes any and all combinations of one or more of the associated listed items.

Spatially relative terms, such as "bottom," "beneath," "below," "lower," "top," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating methods for fabricating a semiconductor device according to some embodiments of the present invention, and FIGS. 2A to 2D are cross-sectional views showing parts of the semiconductor device to explain the fabrication procedures of FIG. 1.

Referring to FIGS. 1 and 2A, an isolation region 105 is formed on a substrate 100. A gate electrode 220 is deposited on a gate dielectric layer 210 on the substrate 100. Transistor regions 110, 120, 210, and 220 are de fined on the substrate 100 (operation S110).

The semiconductor substrate 100 may include a silicon substrate, SOI (silicon on insulator), a Ga—As substrate, a Si—Ge substrate, a ceramic substrate, a quartz substrate, and/or a glass substrate for a display device. Si bonds and dangling bonds are present on a surface of the substrate 100 formed of silicon.

The gate dielectric layer 110 is formed of a material such as a silicon oxide film (SiOx) film and/or a silicon oxy-nitride (SiON) film. The gate dielectric layer 110 may be deposited by chemical vapor deposition ("CVD"), plasma enhanced chemical vapor deposition ("PE-CVD"), and/or high density plasma chemical vapor deposition ("HDP CVD"). A silane group gas such as $SiH_4$ and a reaction gas such as a $H_2$ gas, and an $NH_3$ gas can be used for deposition of the gate dielectric layer 210. During a plasma process within a reaction chamber, atoms and ions, such as neutral hydrogen, $H^+$, $SiH^+$, and $NH^+$ are present in the plasma, and these atoms and ions can combine with the dangling bonds on the surface of the substrate 100 to form Si—NH bonds. Because such Si—NH bonds are unstable, when a negative bias is applied to the gate electrode 220, holes on the surface of the substrate 100 move toward the gate dielectric layer 210, and consequently, H of the Si—H bond is changed into $H^+$ and the dangling bond is formed which can cause device deterioration that leads to NBTI phenomenon in which a threshold voltage is altered. Furthermore, other phenomenon, such as a hot carrier injection (HCI) phenomenon, can occur in which carriers move from a source region to a drain region passes through a channel region to penetrate into the gate dielectric layer 210.

Such undesirable phenomenon can occur not only while the gate dielectric layer 210 is being deposited, but may occur again during subsequent deposition processes or thermal processes for forming other dielectric layers.

The gate electrode 220 may be formed by depositing and patterning a metal such as Ta, Ti, Mo, Hf, Zr, Co, Cr, Ni, Pt, and/or Ru, and/or positing patterning polysilicon and/or tungsten.

A first spacer 240 and a second spacer 330 may be sequentially formed on side walls of the gate electrode 220 if desired. An etch stop layer 310, which has a selection ratio different from that of a substance that forms the second spacer 330, may be used to control a region in which the second spacer 330 is formed.

In order to form the source/drain regions 110, 120, and 130, a source/drain non-crystallized region 110 and a gate non-crystallized region (not shown) may be first formed by implanting impurities such as Ge, Xe, and Si into the substrate 100. Then, high-concentration and low-concentration source/drain regions 120 and 130 may be formed by implanting n-type or p-type impurities into the substrate 100. A rapid thermal process is performed on the source/drains regions 110, 120, and 130 to attempt to remove damage due to the ion implantation and to electrically activate the implanted impurities.

Next, a silicidation process is performed to deposit silicide layers 410 and 420 on the substrate 100 (operation S120).

To perform the silicidation process, a refractory metal having low electric resistance and high thermal stability, e.g., at least one selected from the group consisting of Ti, Mo, W, Co, Ni, Ta, Pt, and Pd, is deposited on the substrate 100. In response to a loss of Si in a subsequent heat treatment process or specific resistivity of the silicide layers 410 and 420, Ni may, for example, be used as the refractory metal.

Then, a thermal process is performed at a temperature between 300 and 750° C. using, for example, a rapid thermal process device or a furnace. The thermal process causes a reaction between metal and silicon in a region where a metal layer for silicide contacts the silicon, and a silicide layer is deposited. That is, the silicide layers 410 and 420 including metal can be deposited on the source/drain regions 110, 120, and 130, and the silicide layers 410 and 420 can also be deposited on the top of the gate electrode 220. In this case, the gate non-crystallized region (not shown) and a gate doping region (not shown) on the top of the gate electrode 220 may be changed into silicide layers 410 and 420. However, when NiSi is used as the silicide layers 410 and 420, the thermal process should be performed with care because NiSi may be phase-changed into NiSi2 which has high resistivity when the thermal process temperature exceeds 500° C. and this may cause deterioration of device operational characteristics.

Since a high temperature thermal process is used to deposit the silicide layers 410 and 420, Si—H bonds between the substrate 100 and the gate dielectric layer 210 are damaged and cause deterioration of an interface between the substrate 100 and the gate dielectric layer 210. To avoid such deterioration, a preliminary plasma treatment is performed after forming the silicide layers 410 and 420 (operation S130).

Figure 2B:
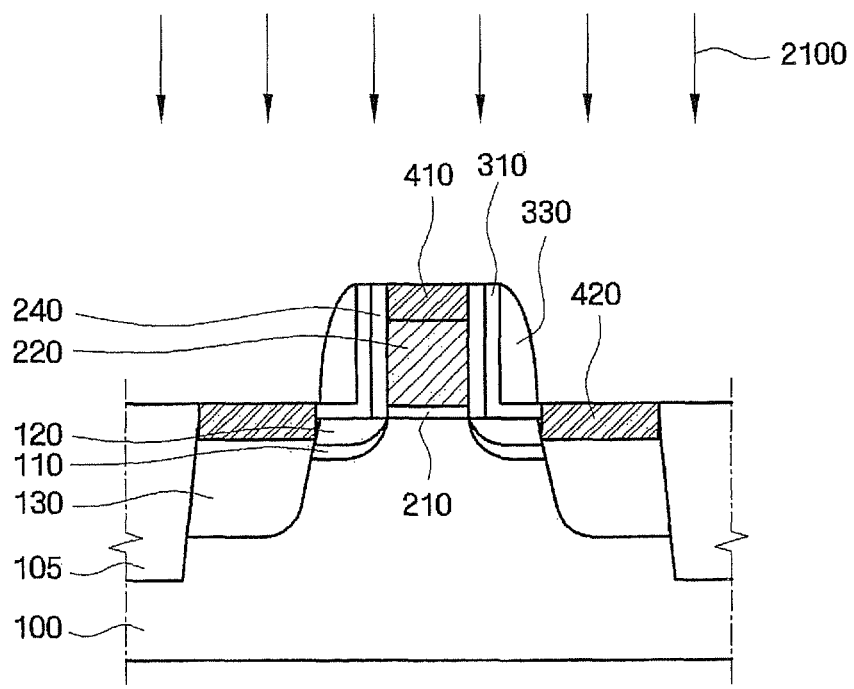

Referring to FIG. 2B, the preliminary plasma treatment 2100 is performed using a non-silane group treatment gas. Deuterium $D_2$ is used as an example of the non-silane group treatment gas. The non-silane group treatment gas can be used solely for the preliminary plasma treatment 2100, but also at least one of nitrogen N2, argon Ar and helium He, as a carrier gas, can be used together.

The preliminary plasma treatment 2100 may be performed at a temperature between 300 and 700° C. However, when the silicide layers 410 and 420 are formed of NiSi, the preliminary plasma treatment 2100 may be performed at a relatively low temperature between 300 and 500° C. in order to avoid increased resistivity. The preliminary plasma treatment 2100 may be performed with the electric power between 50 and 1000 watts and a pressure between 1 mTorr and 50 Torr and in a temperature between 300 and 700° C. for about between 10 seconds and 5 minutes.

When the preliminary plasma treatment 2100 is performed as described above, the non-silane group treatment gas penetrates into the second spacer 330 and then diffuses through the interface boundary between the substrate 100 and the gate dielectric layer 210. Accordingly, the hydrogen atoms, which were produced between the substrate 100 and the gate dielectric layer 210 in the pervious procedure during which the gate dielectric layer 210 was deposited, are replaced by deuterium atoms. That is, the Si—H bonds and dangling bonds formed on the interface between the substrate 100 and the gate dielectric layer 210 are removed and Si-D bonds are created. As a result, the Si—H bonds which cause the HCI phenomenon and the NTBI phenomenon can be decreased to improve the operational characteristics of the semiconductor device.

As described above, the preliminary plasma treatment 2100 and the deposition of the gate dielectric layer 210 are performed sequentially. The preliminary plasma treatment 2100 is performed after the gate dielectric layer 210 is deposited so that the process variables for the deposition of the gate dielectric layer 210 can be controlled accurately and, thus, the desired properties of the gate dielectric layer 210 can be obtained and the interface between the gate dielectric layer 210 and the substrate 100 can be stabilized.

Figure 2C:
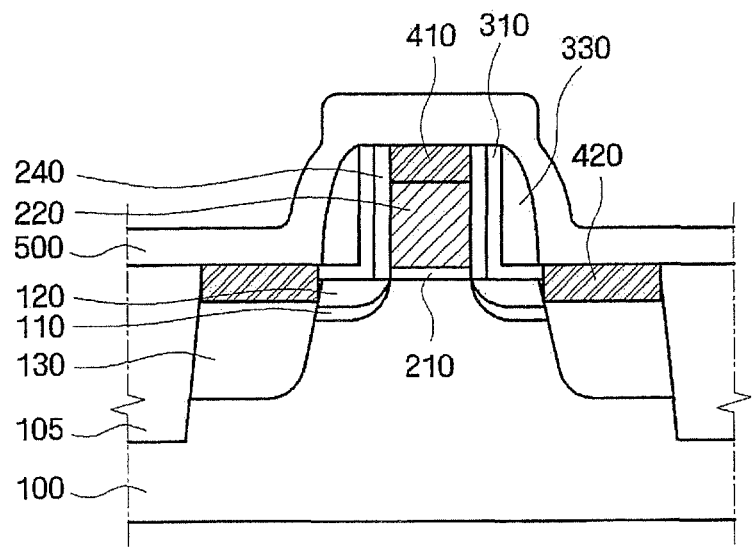

Referring now to FIG. 2C, an etch stop layer 500 is deposited to control the depth of etching which will be performed during formation of a metal line (not shown) in a subsequent procedure (operation S140). The etch stop layer 500 may be formed of, for example, silicon oxy-nitride (SiON), and may be deposited through a CVD process and/or a PE-CVD process, such as used to form the gate dielectric layer 210. Because a high-temperature deposition process is used to form the etch stop layer 500, it is likely that more device deterioration occurs during deposition of the etch stop layer 500 than during deposition of the dielectric layer 210. Moreover, a portion of the Si-D bonds formed during the preliminary plasma treatment (referring to as 2100 in FIG. 2B) may be destroyed during this high-temperature process to form the etch stop layer 500, and new Si—H bonds may be formed. These new Si—H bonds can cause further device deterioration.

Figure 2D:
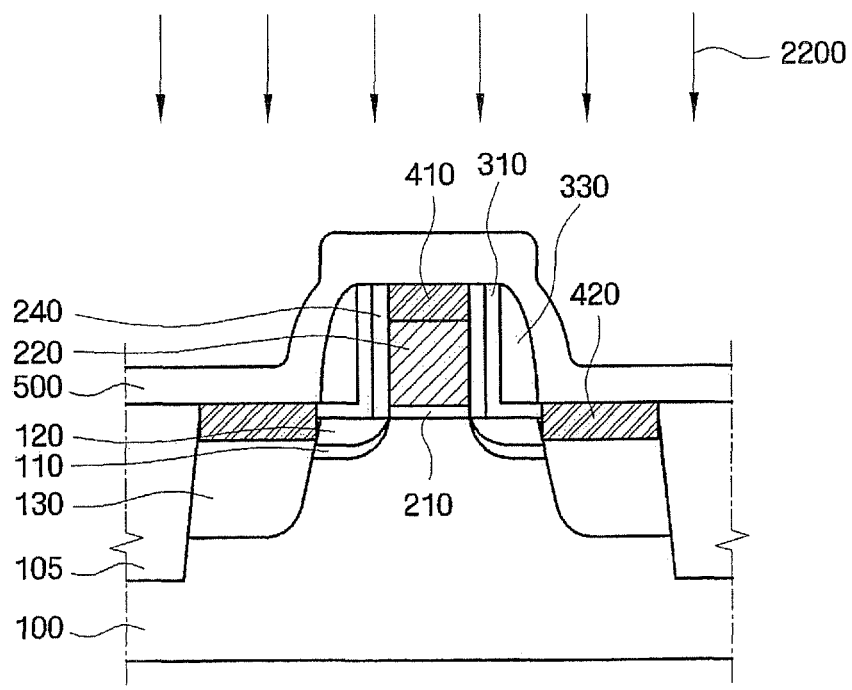

Referring now to FIG. 2D, a plasma treatment 2200 is performed (operation S150). A non-silane group treatment gas, for example, deuterium is used for the plasma treatment 2200, such as described above for the preliminary plasma treatment 2100 (in FIG. 2B). In addition, like used in the preliminary plasma treatment 2100, the plasma treatment 2200 may also use at least one selected from nitrogen ($N_2$), argon (Ar) and helium (He) as a carrier of the non-silane group treatment gas. Furthermore, the plasma treatment 2200 can be performed in the same temperature range as was used for the preliminary plasma treatment 2100.

The plasma treatment 2200 causes deuterium to penetrate into the etch stop layer 500 and the second spacer 330 and diffuse into the interface between the substrate 100 and the gate dielectric layer 210. As a result, the Si—H and dangling bonds, which were produced in the course of deposition of the etch stop layer 500 are replaced by new $D^+$ and Si-D bonds, which may improve the operational characteristics of the semiconductor device.

Because the plasma treatment 2200 and the deposition of the etch stop layer 500 are performed sequentially, with the plasma treatment 2200 being carried out after the etch stop layer 500 is deposited, the process variables desired for the deposition of the etch stop layer 500 may be more accurately controlled and, thus, the thickness and composition of the etch stop layer 500 may be more precisely controlled. Also, during the high-temperature process to deposit the etch stop layer 500, a large amount of Si—H bonds can be produced on the interface between the substrate 100 and the gate dielectric layer 210, but these bonds can be removed afterwards to attempt to improve and stabilize the operational characteristics of the device.

Then, an interlayer dielectric layer (not shown) is deposited on the top of the etch stop layer 500 (operation S160). The interlayer dielectric layer can be formed from a substance having a different etching selection ratio from that of the etch stop layer 500.

A bottom metal line (not shown) is formed thereon and configured to supply an electric signal to the semiconductor device (operation S170).

The effect of the preliminary plasma treatment 2100 and the plasma treatment 2200 on the properties of the interface between the substrate 100 and the gate dielectric layer 210 will now be described with reference to FIGS. 3A to 3C.

Figure 3A:
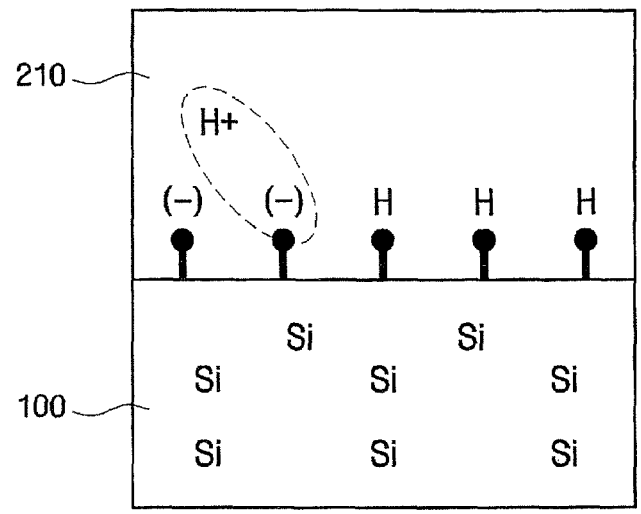
FIGS. 3A to 3C are cross-sectional views that illustrate effects that may increase reliability of the semiconductor device fabricated according to the methods in FIG. 1.

Referring to FIG. 3A, dangling bonds and Si—H bonds are created on the interface between the substrate 100 and the gate dielectric layer 210 by atoms and ions in the plasma, such as neutral hydrogen, H$^+$, SiH$^+$, and NH$^+$, produced during the high-temperature CVD process. More particularly, Si— bonds on the substrate 100 react with H$^+$ to form Si—H bonds. Such Si—H bonds at the interface may deteriorate the operational characteristics of the device.

Figure 3B:
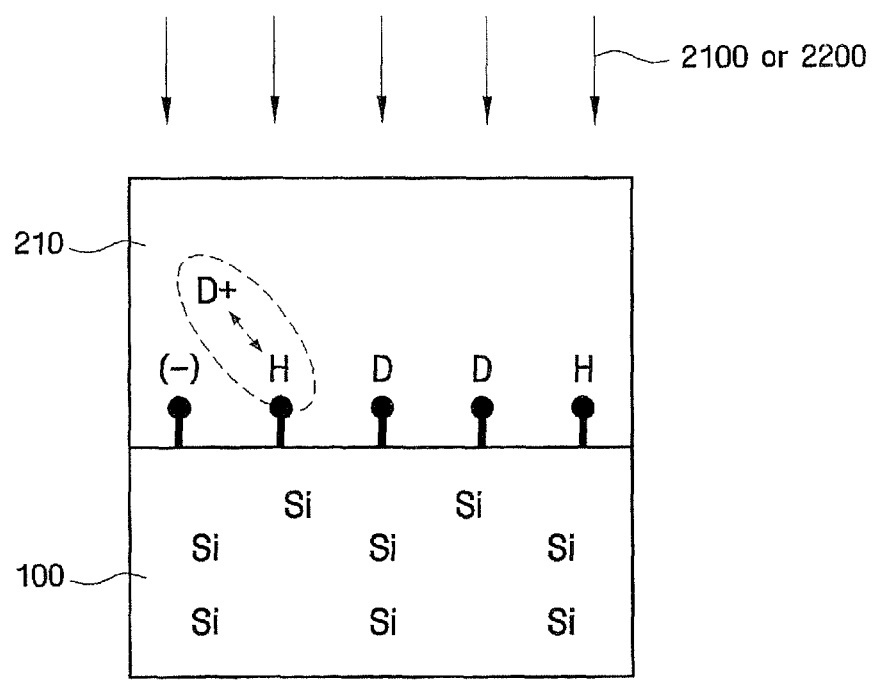

Referring to FIG. 3b, the preliminary plasma treatment 2100 and the plasma treatment 2200 are performed on a portion of the substrate 100 where the Si—H bonds were formed, using a non-silane group treatment gas such as deuterium to form Si-D bonds. This process can be represented by an equation of $2Si—H+2D^+ \rightarrow Si-D+HD$.

Figure 3C:
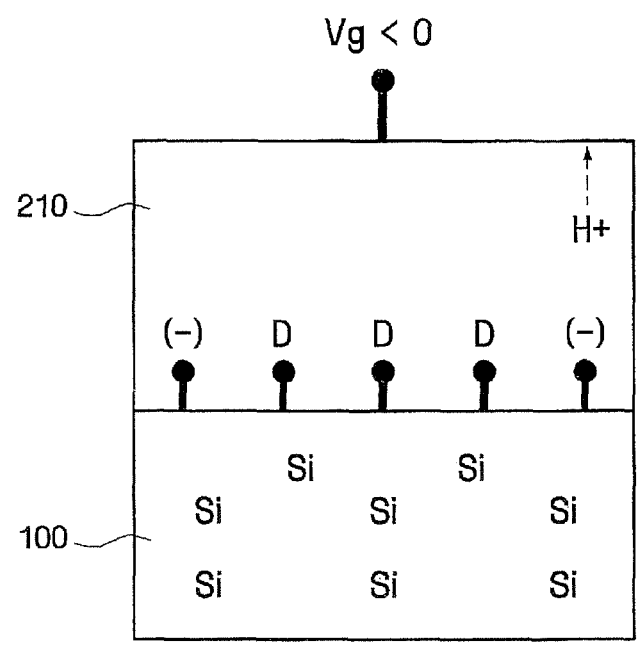

Referring to FIG. 3C, when a negative bias is applied to a gate electrode (not shown) and holes move toward the gate dielectric layer 210 from the substrate 100, the threshold voltage of the device may not appreciably change because the number of dissociated hydrogen ions has been reduced.

According to some embodiments of the present invention, since the dielectric layers are deposited using high-temperatures, the Si—H bonds that are produced can be replaced by the Si-D bonds each high-temperature process is completed. The deposition condition of the dielectric layers may thereby be accurately controlled and deterioration of the interface between the substrate and the gate dielectric layer and the device can be reduced/avoided.

Further methods of fabricating a semiconductor device will now be described in detail with reference to FIGS. 4 and 5A to 5D in accordance with some embodiments of the present invention. For convenience of explanation, the processes used in FIGS. 4 and 5A to 5D that are the same as those described above are not repeated here for brevity or are briefly described.

Referring to FIG. 4, transistor regions 110, 120, 210, and 220 are defined on a substrate 100 (operation S210), and an etch stop layer 500 is deposited using silane group gas (operation S220).

Then, a plasma process can be performed under the same conditions as in the embodiments in FIG. 1 (operation S230).

Figure 5A:
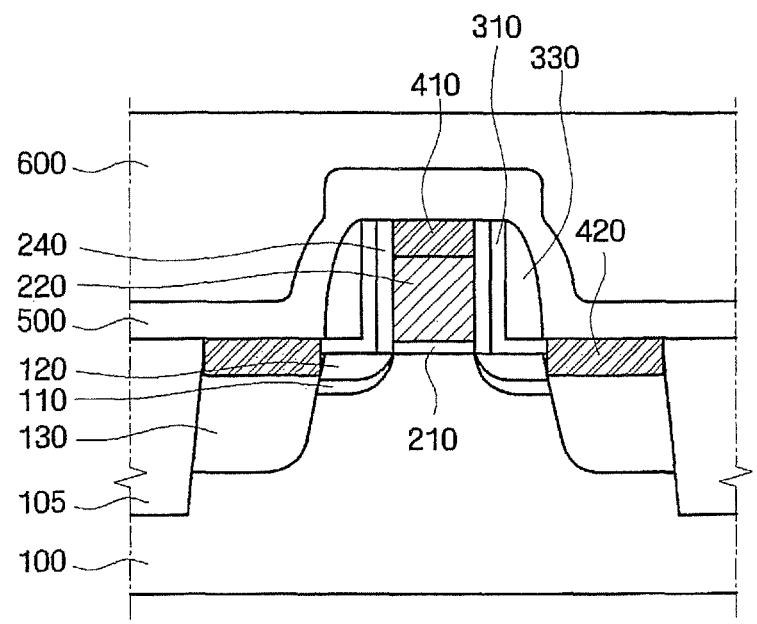
FIGS. 5A to 5D are cross-sectional views showing parts of the semiconductor device to explain the fabrication procedures of the methods in FIG. 4.

Referring to FIGS. 4 and 5A, an interlayer dielectric layer 600 is deposited on the top of the etch stop layer 500 (operation S240). The interlayer dielectric layer 600 may be formed of, for example, SiO2, SiOF, and BFSG (boro phosphor silicate glass), and may be deposited using a CVD process. The interlayer dielectric layer 600 may be formed from a material which has a different etching selection ratio from that of the etch stop layer 500. When the interlayer dielectric layer 600 is formed using a CVD process, a high-temperature silane group treatment gas can be used during this process, and dangling bonds or Si—H bonds may be formed on the interface between the substrate 100 and the gate dielectric layer 210.

Figure 5B:
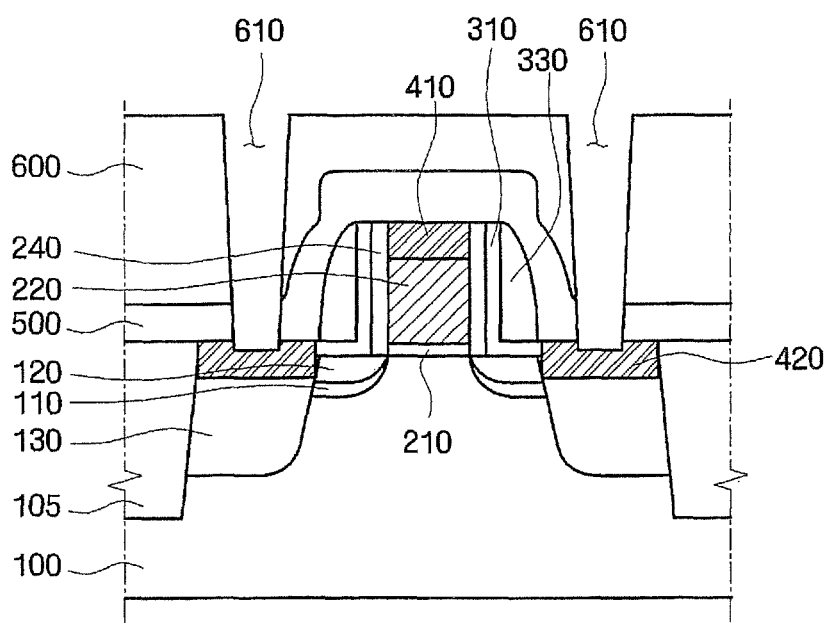

Then, referring to FIGS. 4 and 5B, contact holes are formed to connect with source/drain regions 110, 120, and 130 (operation S250). In order to form the contact holes 610, a photoresist pattern (not shown) is formed on the top of the interlayer dielectric layer 600 to correspond to the width of the source/drain regions 110, 120, and 130. Then, the interlayer dielectric layer 600 is etched using the photoresist pattern as an etching mask. At this stage, the etch stop layer 500 is hardly etched since it has different etching selection ratio from the interlayer dielectric layer 600. Then, the etch stop layer 500 is etched to form the contact holes 610 which penetrate through the interlayer dielectric layer 600 and the etch stop layer 500 and connect with the source/drain regions 110, 120, and 130.

Figure 5C:
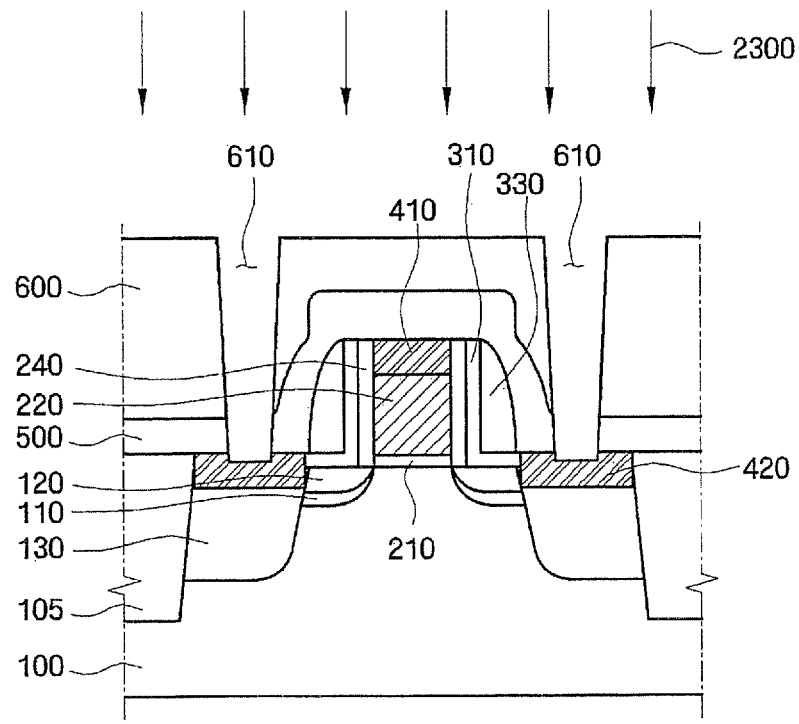

Referring to FIGS. 4 and 5C, after completing the formation of the contact holes 610, a subsequent plasma process 2300 is performed on the substrate 100 and, more particularly, on the interface between the substrate 100 and the gate dielectric layer 210, using a non-silane group treatment gas including deuterium (operation S260). The subsequent plasma process 2300 may be performed in-situ, in a same chamber without breaking vacuum seal, by using the same gas as was used for the earlier plasma process (not shown) under the same conditions as for the earlier plasma process. More specifically, after the plasma process is performed using a non-silane group treatment gas in the same chamber, the gas is replaced by a silane group gas and then the interlayer dielectric layer 600 is deposited using the silane group gas. Subsequently, the interlayer dielectric layer 600 is dry-etched to form the contact holes 610, the subsequent plasma process 2300 can be performed using a non-silane group treatment gas, and then the substrate 100 can be taken out of the chamber. Accordingly, the time needed for the plasma process and the subsequent plasma process 2300 may be reduced.

During the subsequent plasma process 2300, the deuterium penetrates into the interlayer dielectric layer 600 and the contact holes 610 to diffuse into the interface between the substrate 100 and the gate dielectric layer 210. Consequently, the hydrogen atoms produced on the interface between the substrate 100 and the gate interlayer dielectric layer 210 by the subsequent plasma process 2300 when the interlayer dielectric layer 600 and the contact holes 610 are deposited can be replaced by deuterium atoms, and the Si—H bonds and dangling bonds can thereby be reduced/removed and Si-D bonds can be formed.

Since the subsequent plasma process 2300 can be performed before metal lines 700 (in FIG. 5D) are deposited, the deuterium can more easily diffuse into the interface between the substrate 100 and the gate dielectric layer 210 without interference of the metal. Furthermore, since the subsequent plasma process is performed after the high-temperature deposition process has been completed, Si—H can be replaced by Si-D using a procedure where no more Si—H may be formed by the thermal processes. Thus, the device reliability may be improved.

Figure 5D:
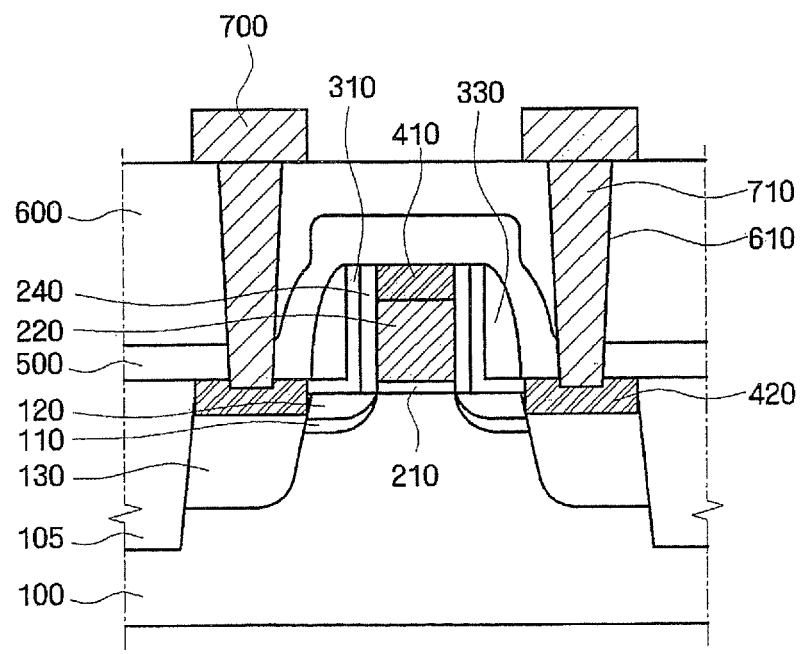

Referring to FIGS. 4 and 5D, bottom metal lines 700 and plugs 710 are deposited (operation S270). The plugs 710 electrically interconnect the bottom metal lines 700 and the source/drain regions 110, 120, and 130.

The plugs 710 can be formed by filling up the contact hole 610 with a conductive substance and using a chemical mechanical planarization (CMP) process to align an upper surface of the plugs 710 with an adjacent major surface of the interlayer dielectric layer 600. The conductive substance which fills the contact hole 610 may be, for example, tungsten W. A conductive substance is then deposited and patterned to form the bottom metal lines 700. The bottom metal line 700 may be formed of, for example, aluminum (Al).

Further methods of fabricating a semiconductor device according other embodiments of the present invention are now described with reference to FIG. 6.

Like for the embodiments in FIG. 1, transistor regions are defined on a substrate 100 (operation S310), and silicide layers are deposited on the substrate 100 (operation S320). A preliminary plasma process is then performed (operation S330) thereon. The process conditions for the preliminary plasma process can be the same as the embodiment in FIG. 1.

Next, like for the embodiment in FIG. 1, an interlayer dielectric layer is deposited (operation S340), and then contact holes are formed therein (operation S350). Then, a subsequent plasma process is performed (operation S360). The process conditions and the effects of the subsequent plasma process according to the present embodiments can be the same as those as described above for FIG. 4. Bottom metal lines 700 and plugs 710 can be deposited (operation S370) thereon.

According to the present embodiments of FIG. 6, the preliminary plasma process and the subsequent plasma process are selectively performed after the thermal process, which may improve device reliability and may also improve the process efficiency.

Methods of fabricating a semiconductor device will now be described in further detail with reference to FIGS. 7 to 22.

Figure 8:
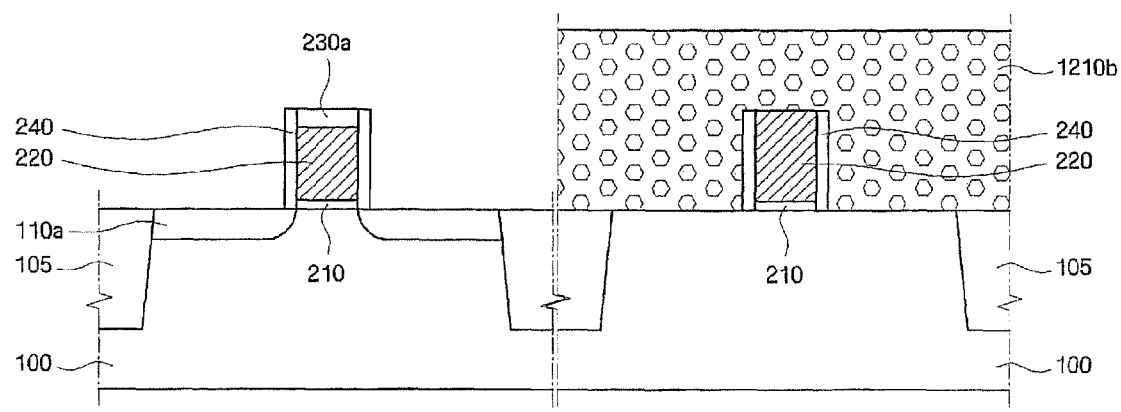
FIGS. 8 to 22 are cross-sectional views of the semiconductor device for explaining the fabrication procedures of the methods in FIG. 7.

Referring to FIGS. 7 and 8, transistor regions 110A, 210, 220, and 230A are deposited on a substrate 100 (operation S410).

The substrate 100 initially has device division regions 105 and gate dielectric layers 210 deposited thereon, and the gate electrodes 220 are deposited on the substrate 100. The substrate 100 is divided into an NMOS region and a PMOS region, and thus a P-well or an N-well can be formed thereon.

First spacers 240 are formed on side walls of each gate electrode 220. The first spacers 240 may be formed by performing an oxidation process on the semiconductor substrate 100. The oxidation process may be a reoxidation process that forms the first spacers 240 on the side walls of the gate electrode 220 and the semiconductor substrate 100. Hot carriers can be removed and the reliability of the semiconductor device can be improved. The thickness of the first spacers 240 can be controlled to control a distance between source/drain regions 120a (referring to FIG. 9), which will be formed on opposite sides of the gate electrode 220, and consequently, the length of a channel can be controlled. Each of the first spacers 240 may be, for example, I-shaped and its thickness can be adjusted in order to achieve a desired distance between the source/drain regions.

Then, the PMOS region of the substrate 100 can be covered by a photoresist pattern 1210b, and impurities can be implanted into the NMOS region to form a source/drain non-crystallized region 110a and a gate non-crystallized region 230a. The impurities may be Ge, Xe, or Si. The gate non-crystallized region 230a is formed on the top of the gate electrode 220, and the source/drain non-crystallized region 110a is formed on the substrate 110 of each side of the gate electrode 220.

Figure 9:
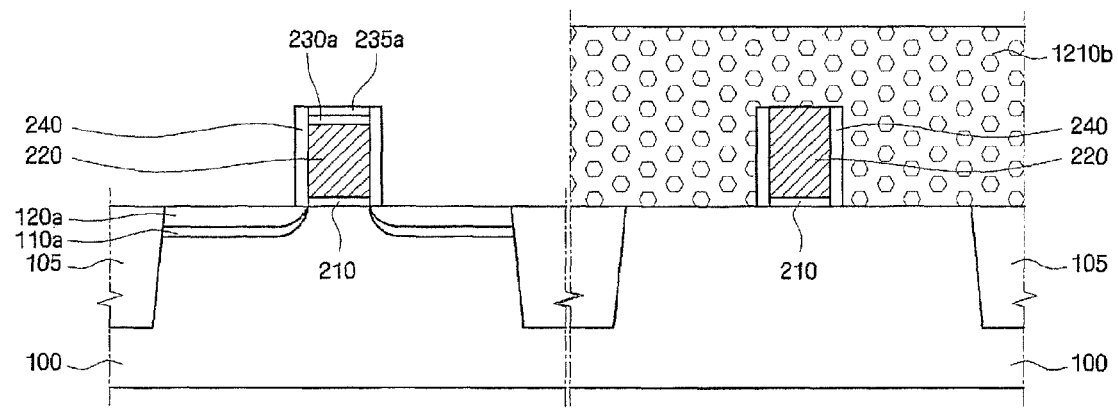

Referring to FIG. 9, while the PMOS region is covered by the photoresist pattern 1210b, n-type impurities, for example, P, As, or Sb ions, can be implanted into the NMOS region to form a low-concentration source/drain region 120a, which can overlap the source/drain non-crystallized region 110a, and a gate doping region 235a can be formed on the top of the gate non-crystallized region 230a. The gate doping region 235a can function to reduce the resistance and may also reduce a depletion region when a bias is applied to the gate electrode 220.

Figure 10:
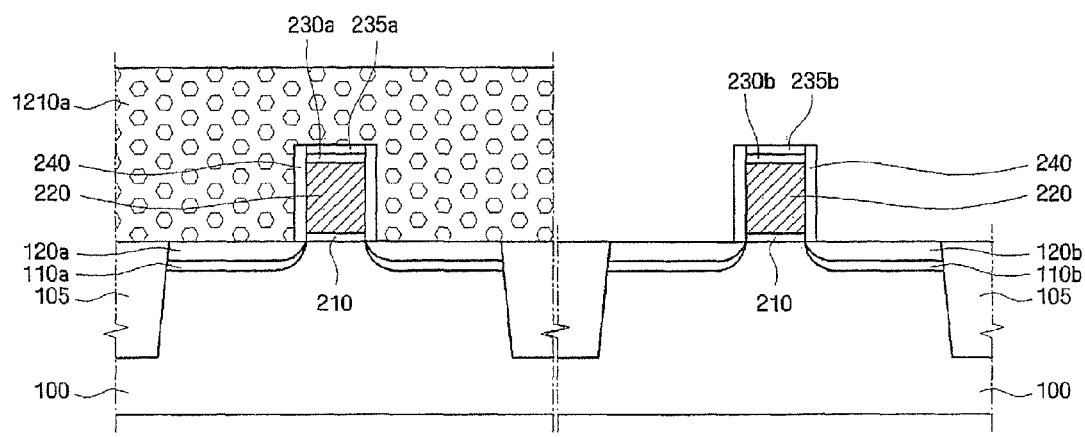

Referring to FIG. 10, the photoresist pattern 1210b is removed from the PMOS, the NMOS region is covered by a photoresist pattern 1210a, and a source/drain non-crystallized region 110b and a gate non-crystallized region 230b are formed on the PMOS region. Then, p-type impurities, for example, B or BF3 ions, are implanted into the PMOS region to form a low-concentration source/drain region 120b, which overlaps the source/drain non-crystallized region 110b, and a gate doping region 235b on the top of the gate non-crystallized region 230b.

Figure 11:
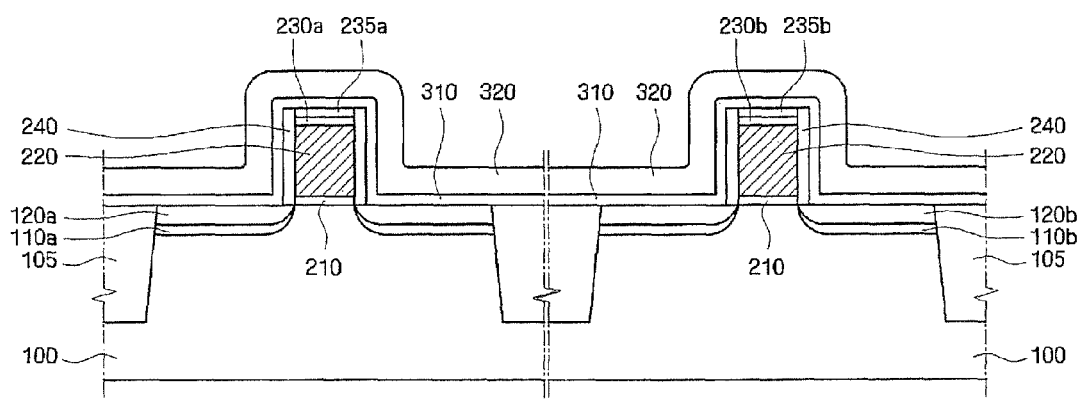

Referring to FIG. 11, the photoresist pattern 1210a is removed from the NMOS region, a spacer etch stop layer 310 and a spacer dielectric layer 320 are deposited on the substrate 100 using a CVD method. The spacer etch stop layer 310 is formed of, for example, oxide, and the spacer dielectric layer 320 is formed of, for example, nitride.

Figure 12:
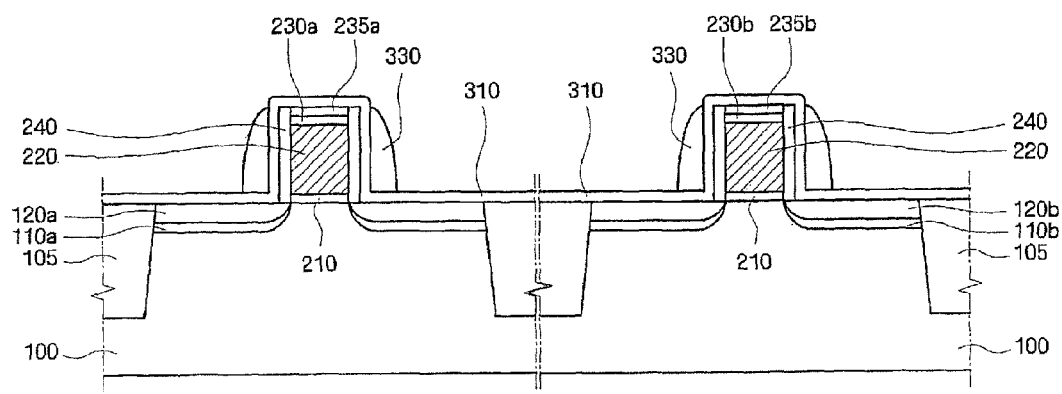

Referring to FIG. 12, the spacer dielectric layer 320 is etched to form second spacers 330.

Figure 13:
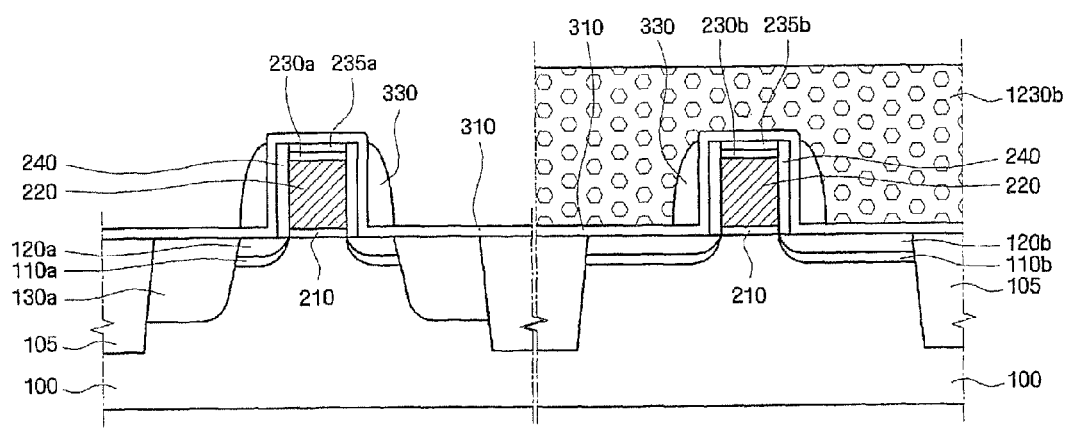

Then, referring to FIG. 13, the PMOS region is covered by a photoresist pattern 1230b, and high-concentration n-type impurities, for example, p, As, or Sb ions, are implanted into the NMOS region. As a result, a high-concentration source/drain region 130a which overlaps the low-concentration source/drain region 120a is formed on the NMOS region. Due to the high-concentration source/drain region 130a, which has higher concentration than the low-concentration source/drain region 120a, an electric field of the source/drain regions 110a, 120a, and 130a is decreased, and thus the threshold voltage characteristic may be improved.

Figure 14:
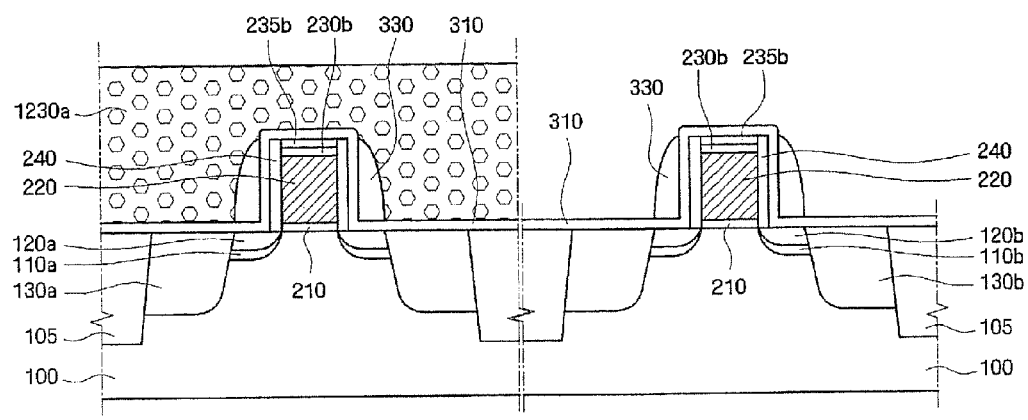

Referring to FIG. 14, the photoresist pattern 1230b is removed from the PMOS region, and the NMOS region is covered by a photoresist pattern 1230a. Then, high-concentration p-type impurities are implanted into PMOS region. As a result, a high-concentration source/drain region 130b which overlaps the low-concentration source/drain region 120b and has higher concentration than the low-concentration source/drain region 120b is formed on the PMOS region.

Figure 15:
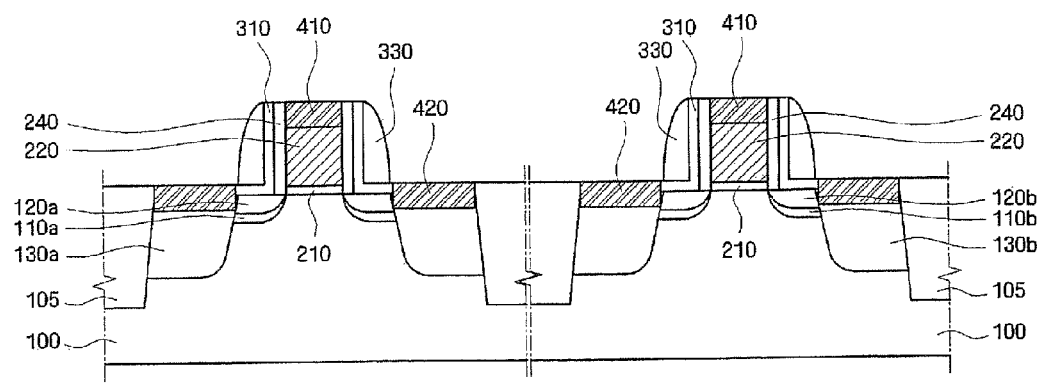

Referring to FIG. 15, the photoresist pattern 1230a is removed from the NMOS region, and a RTP is performed on the source/drain regions 110a, 120a, and 130a to electrically activate the implanted impurities. Subsequently, the spacer etch stop layer 310 is removed from the substrate 100 and the top of the gate electrode 220.

Referring to FIGS. 7 and 15, silicide layers 410 and 420 may be deposited (operation S420) in the same manner as described above for the embodiments in FIG. 1. The silicide layer 410 and 420 may be deposited on the top of the gate electrode 220 and on the high-concentration source/drain regions 130a and 130b. A high-temperature thermal process may be performed in order to deposit the silicide layers 410 and 420, and accordingly dangling bonds or Si—H bonds can be formed on the interface between the substrate 100 and the gate dielectric layer 210. Consequently, a negative bias temperature instability (NBTI) phenomenon or an HCI phenomenon may occur, which may deteriorate operational characteristics of the device.

Figure 16:
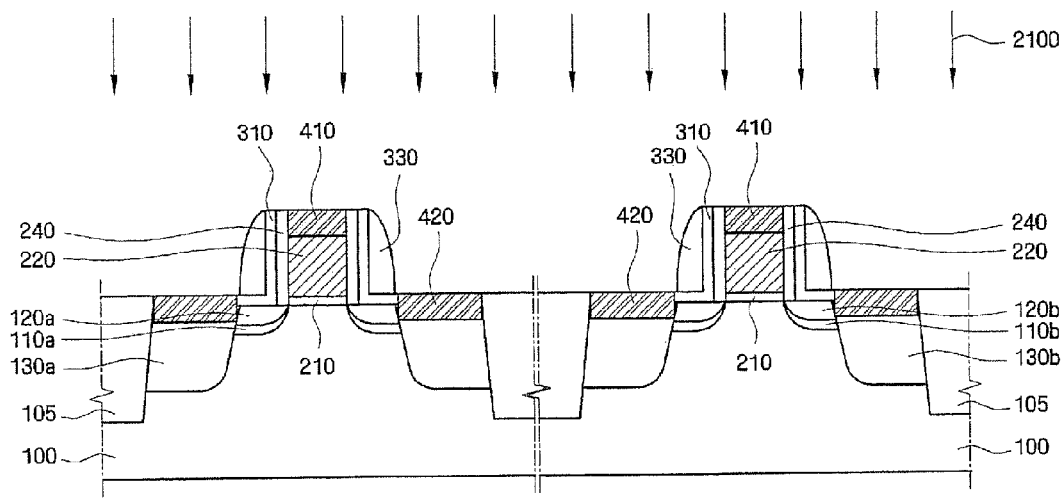

Referring to FIGS. 7 and 16, once the deposition of the silicide layers 410 and 420 is completed, a preliminary plasma process 2100 is performed (operation S430), like described above with regard to the embodiments in FIG. 1, to replace hydrogen atoms with deuterium atoms, which may improve operational characteristics of the device. The preliminary plasma process 2100 is performed using a non-silane group treatment gas which includes deuterium. A carrier gas of the non-silane group treatment gas can include at least one of nitrogen ($N_2$), argon (Ar) or helium (He), like for the embodiments in FIG. 1. The temperature range of the preliminary plasma process 2100 may be the same as used for the embodiments in FIG. 1. When the silicide layers 410 and 420 are formed of NiSi, the preliminary plasma process 2100 may be performed at a temperature between 300 and 500° C. in order to reduce/prevent increased resistivity. The conditions and effects of the preliminary plasma process 2100 according to the present embodiments may be the same as or similar to the embodiments in FIG. 1.

Figure 17:
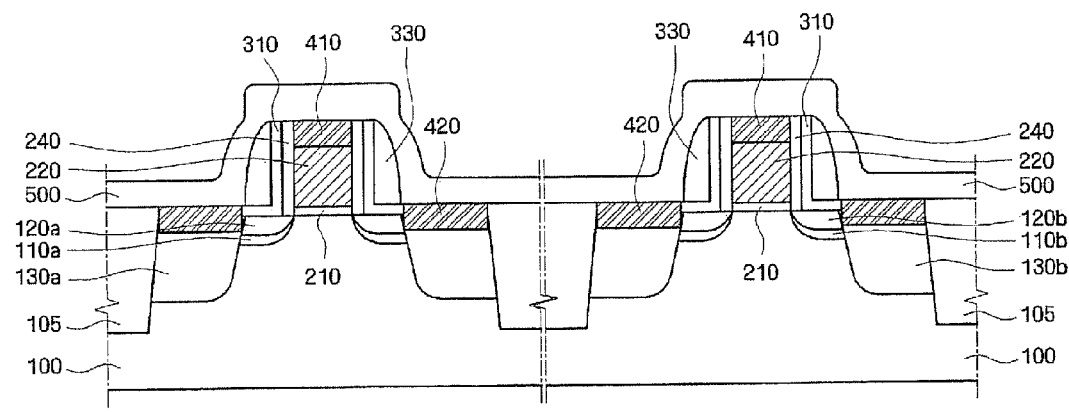

Referring to FIGS. 7 and 17, like for the embodiments in FIG. 1, an etch stop layer 500 which may consist of nitrogen is deposited (operation S440). The etch stop layer 500 may be formed using nitrogen group and silane group gases. Because the process can be performed at a high temperature, some device deterioration may occur again on the interface between the substrate 100 and the gate dielectric layer 210, such as was described above for the deposition of the silicide layers 410 and 420.

Figure 18:
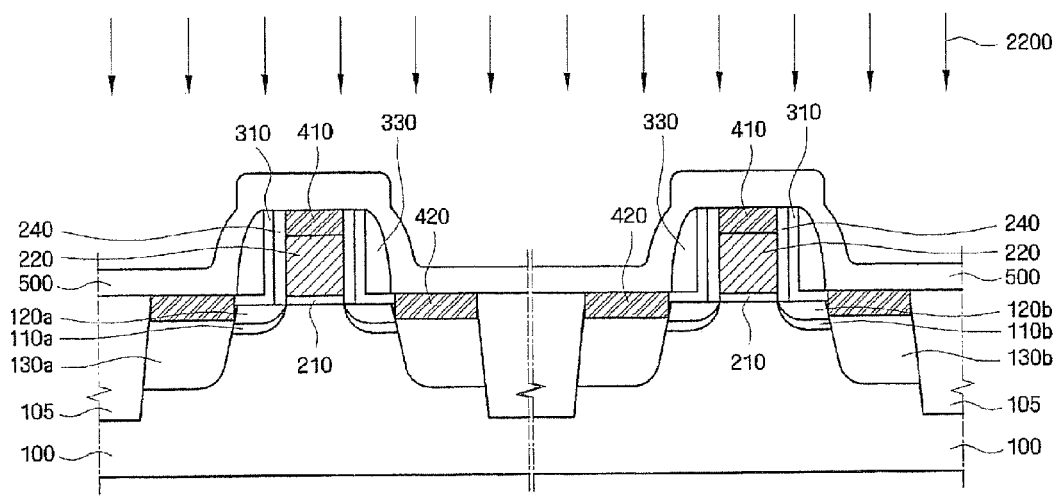

Referring to FIGS. 7 and 18, a plasma process 2200 is performed on the substrate 100 (operation S450), and may be carried out in substantially the same manner as described above for the embodiments in FIG. 1. Accordingly, deuterium permeates into the interface between the substrate 100 and the gate dielectric layer 210, hydrogen atoms can be replaced by the deuterium atoms, and the resulting device characteristics may be improved. The plasma process 2200 may be performed in-situ (in a chamber without breaking vacuum seal) with the deposition of the etch stop layer 500, and thus the process time may be reduced.

Figure 19:
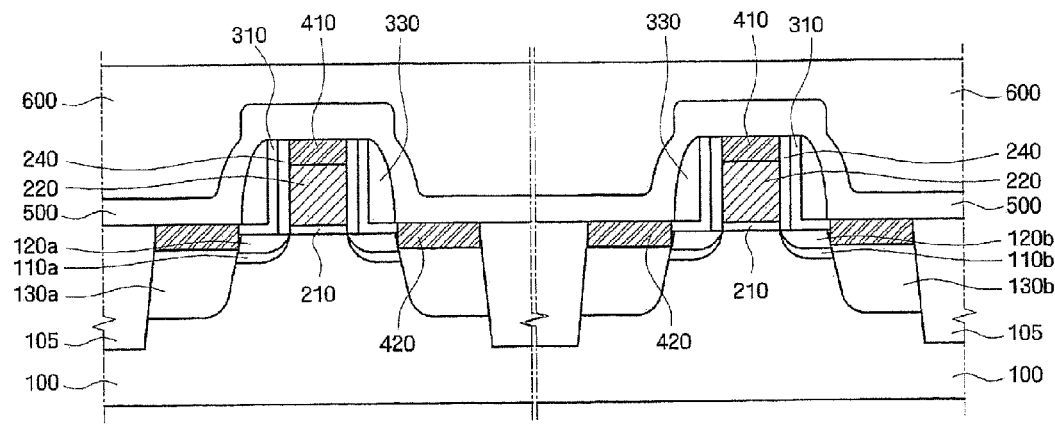

Referring to FIGS. 7 and 19, a metal interlayer dielectric layer 600 is deposited (operation S460), like for the embodiments in FIG. 4.

Figure 20:
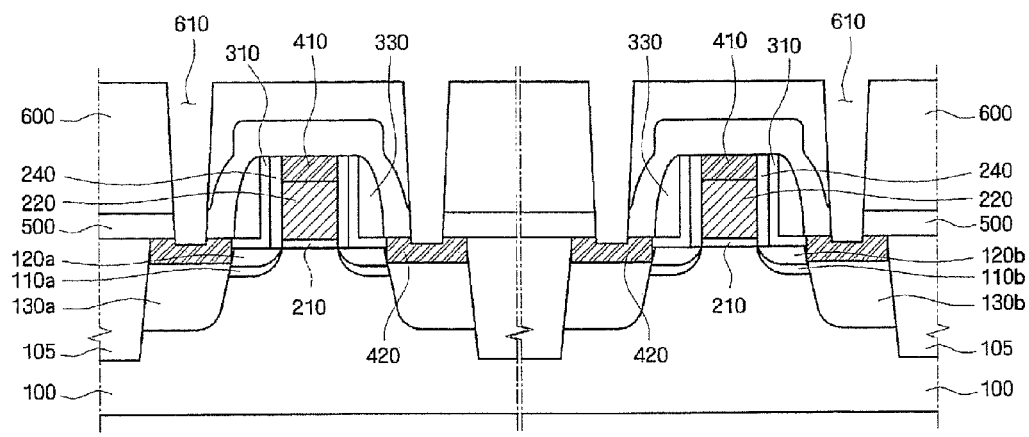

Referring to FIGS. 7 and 20, like for the embodiments in FIG. 4, contact holes 610 are formed (operation S470). The process of depositing the metal interlayer dielectric layer 600 and the contact holes 610 may be performed at a high temperature, and Si—H bonds and dangling bonds may be formed on the interface between the substrate 100 and the gate dielectric layer 210.

Figure 21:
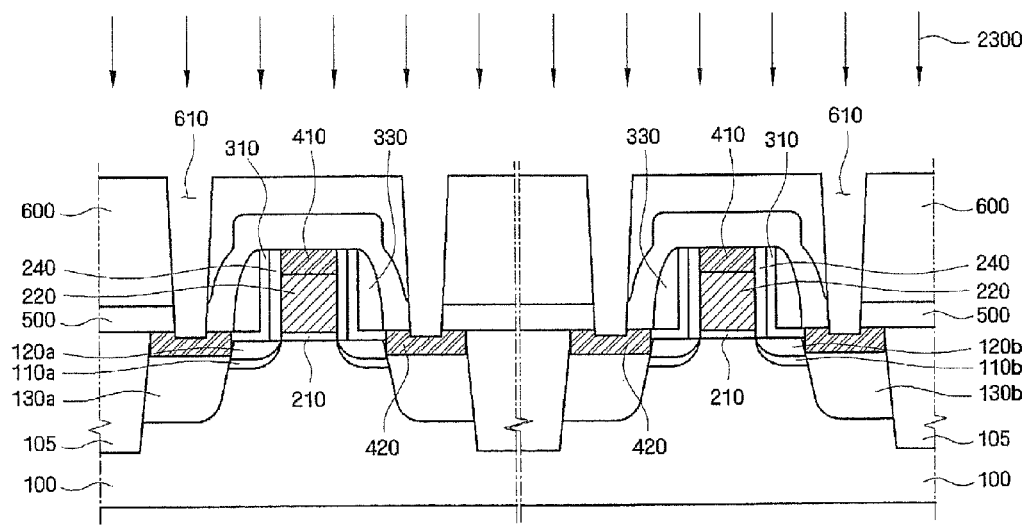

Referring to FIGS. 7 and 21, a subsequent plasma process 2300 may be performed under the same conditions as for the embodiments in FIG. 4, so that deuterium permeates into the interface between the substrate 100 and the gate dielectric layer 210 and hydrogen atoms can be replaced by the deuterium atoms (operation S480). Hence, the operational characteristics of the device may be improved.

Processes for the deposition of the metal interlayer dielectric layer 600 and the subsequent plasma process 2300 may be formed in-situ in the same chamber without breaking vacuum seal. Thus, the process time may be shortened.

Figure 22:
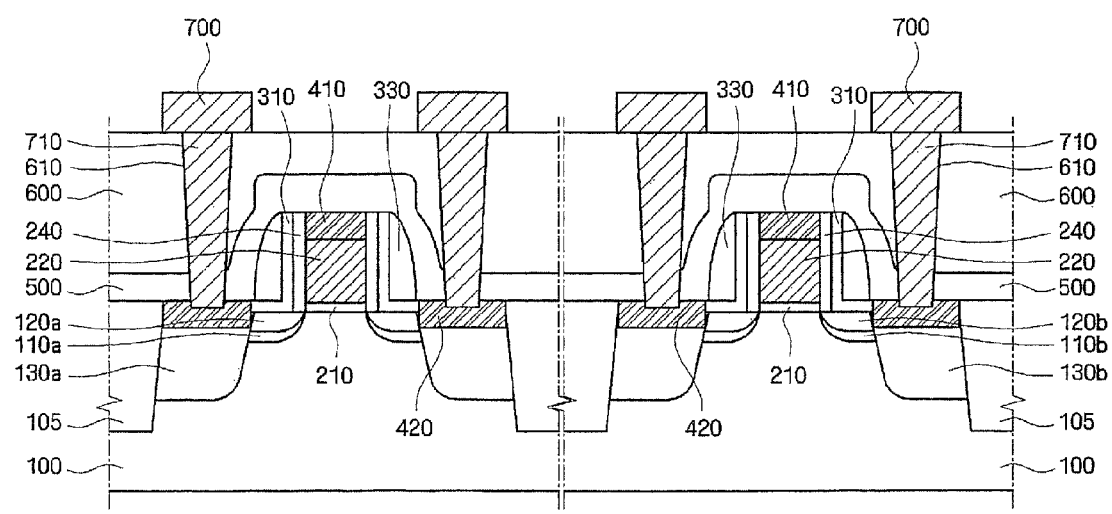

Referring to FIGS. 7 and 22, as for the embodiments in FIG. 4, metal lines 700 and plugs 710 are formed (operation S490). Afterwards, a second interlayer dielectric layer (not shown) and an upper metal (not shown) may be further formed.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a semiconductor device, the method comprising:
    forming a gate oxide layer on a substrate and a gate electrode on the gate oxide layer, and forming a first spacer on opposite side walls of the gate electrode and a second spacer on each first spacer, and a low-concentration source/drain region arranged with the first spacer and a high-concentration source/drain region arranged with the second spacer;
    forming a silicide layer on the gate electrode and the high-concentration source/drain region;
    performing a preliminary plasma process on an interface between the gate oxide layer and the substrate after forming the silicide layer;
    forming an etch stop layer on a surface of the substrate;
    performing a plasma process on the interface between the gate oxide layer and the substrate after forming the etch stop layer;
    forming an interlayer dielectric layer on the etch stop layer;
    forming a contact hole which penetrates through the etch stop layer and the interlayer dielectric layer;
    performing a subsequent plasma process on the interface between the gate oxide layer and the substrate after forming the interlayer dielectric layer; and
    forming a bottom metal line on the interlayer dielectric layer,
    wherein the preliminary plasma process, the plasma process, and the subsequent plasma process are performed using a non-silane treatment gas including deuterium, and
    wherein the subsequent plasma process causes deuterium from a non-silane treatment gas in the contact hole to diffuse therefrom into the interface between the substrate and the gate oxide layer.

2. The method of claim 1, wherein the substrate includes an NMOS region and a PMOS region, the low-concentration source/drain region of the NMOS region is formed by covering the PMOS region with a photoresist pattern and implanting n-type ions into the substrate, and the low-concentration source/drain region of the PMOS region is formed by covering the NMOS region with a photoresist pattern and implanting p-type ions into the substrate.

3. The method of claim 2, further comprising: de-crystallizing the top of the gate electrode and the low-concentration source/drain region by implanting impurities into the substrate before forming the low-concentration source/drain region.

4. The method of claim 1, wherein the non-silane treatment gas further includes at least one carrier gas selected from a group consisting of nitride, argon and helium.

5. The method of claim 1, wherein the forming the etch stop layer and the plasma process are performed in-situ.

6. A method of fabricating a semiconductor device, the method comprising:
    forming a gate oxide layer on a transistor region, which is defined on a substrate, and a gate electrode on the gate oxide layer;
    forming a silicide layer on the gate electrode;
    performing a preliminary plasma process on an interface between the gate oxide layer and the substrate after forming the silicide layer;
    forming a etch stop layer on the substrate;
    forming an interlayer dielectric layer on the silicide layer;

forming a contact hole which penetrates through the etch stop layer and the interlayer dielectric layer after forming the interlayer dielectric layer;

performing a subsequent plasma process on the interface between the gate oxide layer and the substrate after forming the interlayer dielectric layer; and forming a bottom metal line on the interlayer dielectric layer, wherein the preliminary plasma process and the subsequent plasma process are performed using a non-silane treatment gas including deuterium, and wherein the subsequent plasma process causes deuterium from the non-silane treatment gas in the contact hole to diffuse therefrom into the interface between the substrate and the gate oxide layer.

7. The method of claim 6, wherein the non-silane treatment gas further includes at least one carrier gas selected from a group consisting of nitrogen, argon and helium.

8. The method of claim 6, wherein the preliminary plasma process is performed with an electric power of between 50 and 1000 watts and a pressure of between 1 mTorr and 50 Torr and at a temperature of between 300 and 700° C. for between 10 seconds and 5 minutes.

9. The method of claim 6, further comprising: de-crystallizing the transistor region and the top of the gate electrode by implanting impurities into the substrate after forming the gate electrode.

10. The method of claim 6, wherein the forming the interlayer dielectric layer and performing the subsequent plasma process are performed in-situ.

11. The method of claim 6, wherein the subsequent plasma process is performed after forming the contact hole.

12. The method of claim 6, wherein performing the preliminary plasma process comprises performing the preliminary plasma process on the interface between the gate oxide layer and the substrate using the non-silane treatment gas including deuterium after forming the silicide layer but before forming the etch stop layer.

13. The method of claim 12, wherein the subsequent plasma process and the preliminary plasma process are performed at a temperature of between 300 and 700° C.

14. The method of claim 13, wherein the silicide layer includes at least one metal selected from a group consisting of titanium, molybdenum, tungsten, cobalt, and nickel.

15. The method of claim 14, wherein the silicide layer comprises NiSi, and the subsequent plasma process and the preliminary plasma process are performed at a temperature of between 300 and 500° C.

16. The method of claim 6, wherein the subsequent plasma process is performed after forming the contact hole.

* * * * *